United States Patent [19]

Kato et al.

[11] Patent Number: 4,982,435
[45] Date of Patent: Jan. 1, 1991

[54] AUTOMATIC LOUDNESS CONTROL CIRCUIT

[75] Inventors: Masami Kato, Ora; Katsu Horikoshi, Tatebayashi, both of Japan

[73] Assignee: Sanyo Electric Co., Ltd., Osaka, Japan

[21] Appl. No.: 180,483

[22] Filed: Apr. 12, 1988

[30] Foreign Application Priority Data

Apr. 17, 1987 [JP] Japan ............................. 62-58832[U]
Apr. 17, 1987 [JP] Japan ................................. 62-95574
Jul. 1, 1987 [JP] Japan ................................. 62-164719

[51] Int. Cl.[5] ............................................. H03G 9/00
[52] U.S. Cl. ...................................... 381/102; 381/28
[58] Field of Search ..................... 381/1, 27, 98, 102, 381/96, 28

[56] References Cited

U.S. PATENT DOCUMENTS 4,186,273 1/1980 Dodson .................................. 381/28
4,503,554 3/1985 Davis ....................................... 381/1
4,748,669 5/1988 Klayman .................................. 381/1

FOREIGN PATENT DOCUMENTS

877167 10/1979 Belgium .

Primary Examiner—Forester W. Isen
Attorney, Agent, or Firm—Darby & Darby

[57] ABSTRACT

An automatic loudness control circuit for automatically controlling the magnitude of boosting of the low-frequency component of an audio signal in accordance with the output signal level of a power amplifier for driving a loud-speaker. The low-frequency component of the output signal from an audio signal source is boosted by a low frequency boosting circuit to prepare a low-frequency boost signal, which is then added to the output signal of the source, and the resulting signal is fed to the power amplifier. The magnitude of boosting by the boosting circuit is controlled according to the output level of the power amplifier and is therefore increased as the output level lowers. Consequently, the circuit assures optimum loudness control at all times, permitting the loudspeaker to produce dynamic sounds.

10 Claims, 5 Drawing Sheets

FIG.6 PRIOR ART

AUTOMATIC LOUDNESS CONTROL CIRCUIT

FIELD OF THE INVENTION

The present invention relates to automatic loudness control circuits for use in acoustic apparatus such as radio receivers and stereophonic reproduction systems for automatically optimally adjusting the frequency characteristics of an audio signal before feeding the signal to a loudspeaker.

BACKGROUND OF THE INVENTION

Conventional acoustic apparatus are provided with bass control and treble control knobs on the operation panel which are manipulated for adjustment to realize the desired tone.

Figure 6:
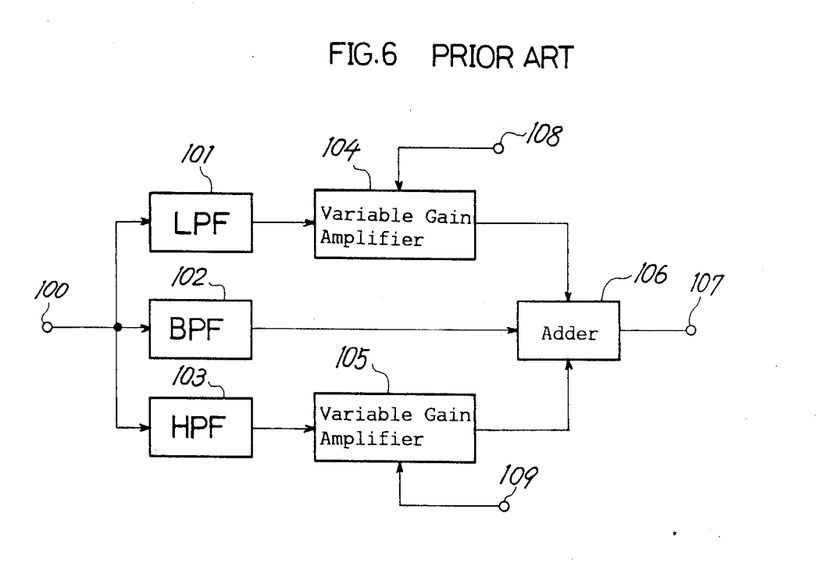
FIG. 6. is a block diagram showing a conventional tone control circuit.

FIG. 6 shows a tone control circuit heretofore proposed for effecting tone control in this manner (Unexamined Japanese Pat. Publication No. SHO 59-212012).

With this circuit, the signal applied to an input terminal 100 is fed to a low-pass filter 101, a band-pass filter 102 and a high-pass filter 103. The output signals from the low-pass filter 101 and the high-pass filter 103 are passed through variable gain amplifiers 104 and 105, respectively, and fed to an adder 106 along with the output signal from the band-pass filter 102. The audio signal obtained at an output terminal 107 is sent to a loudspeaker via a power amplifier.

A bass control signal is applied to a control signal input terminal 108 to adjust the gain of the amplifier 104 for bass control, while a treble control signal is applied to another control signal input terminal 109 to control the gain of the amplifier 105 for treble control.

To reproduce an acoustically dynamic sound, it is generally effective to boost the low-frequency component of the audio signal as the level of the signal lowers. With the conventional circuit of FIG. 6, however, the bass control signal and the treble control signal are prepared by adjusting the corresponding knobs on the operation panel, so that every time the level of the audio signal varies, there arises a need for tone adjustment to realize optimum frequency characteristics, thus entailing the problem of a cumbersome adjustment procedure.

The tone control circuit of FIG. 6 includes three filters, i.e., the low-pass filter 101, band-pass filter 102 and high-pass filter 103 which require capacitors of large capacity. This presents extreme difficulties in incorporating the three filters 101, 102 and 103 into the tone control circuit when the circuit is to be fabricated in the form of an IC, consequently offsetting the advantage to be obtained by constructing the circuit as an IC.

SUMMARY OF THE INVENTION

An object of the present invention is to provide an automatic loudness control circuit which is adapted to detect the output level of an audio signal and to automatically adjust the frequency characteristics of the signal in accordance with the detected level so as to obtain an optimum tone at all times.

Another object of the invention is to provide an automatic loudness control circuit a major portion of which can be fabricated into an IC.

Another object of the invention is to provide an automatic loudness control circuit which is adapted to selectively feed to a loudspeaker ore of an output signal subjected to loudness control according to the level of an audio signal and an output signal not subjected to loudness control without permitting occurrence of any noise due to a change-over from one signal to the other.

Still another object of the invention is to provide an automatic loudness control circuit for controlling the loudness characteristics of an audio signal according to the output level thereof with high accuracy, the circuit being normally operable despite some variations in the power supply voltage.

Still another object of the present invention is to provide an automatic loudness control circuit wherein there is not occurred any clipping in the boosting circuit provided for obtaining the best loudness characteristics eve when a power supply of low voltage like 1.5V is applied.

Other objects of the invention will become apparent from the description of embodiments given later.

The automatic loudness control circuit of the present invention comprises a low frequency boosting circuit for extracting a low-frequency component from the output signal of an audio signal source and boosting the low-frequency component to prepare a low-frequency boost signal, an addition circuit for adding the low-frequency boost signal to the output signal from the audio signal source, a power amplifier for feeding the output signal of the addition circuit upon amplification, a level detection circuit for detecting the output level of the power amplifier, and a boosting control circuit for controlling the magnitude of boosting by the low frequency boosting circuit in accordance with the detection signal of the level detection circuit. The boosting control circuit prepares a control signal for increasing the magnitude of boosting by the low frequency boosting circuit as the output level lowers and feeds the control signal to the low frequency boosting circuit.

Accordingly, the low frequency boosting circuit greatly boosts the low-frequency component of the audio signal source when the output level lowers and feeds the resulting signal to the addition circuit. Conversely, when the output level rises, the boosting circuit boosts the low-frequency component of the audio signal by a small magnitude and feeds the resulting signal to the addition circuit.

The audio signal to be fed to the loudspeaker from the power amplifier has frequency characteristics wherein the low-frequency component is boosted to a greater magnitude as the output level lowers, causing the loudspeaker to produce a dynamic sound.

DETAILED DESCRIPTION OF EMBODIMENTS

Figure 1:
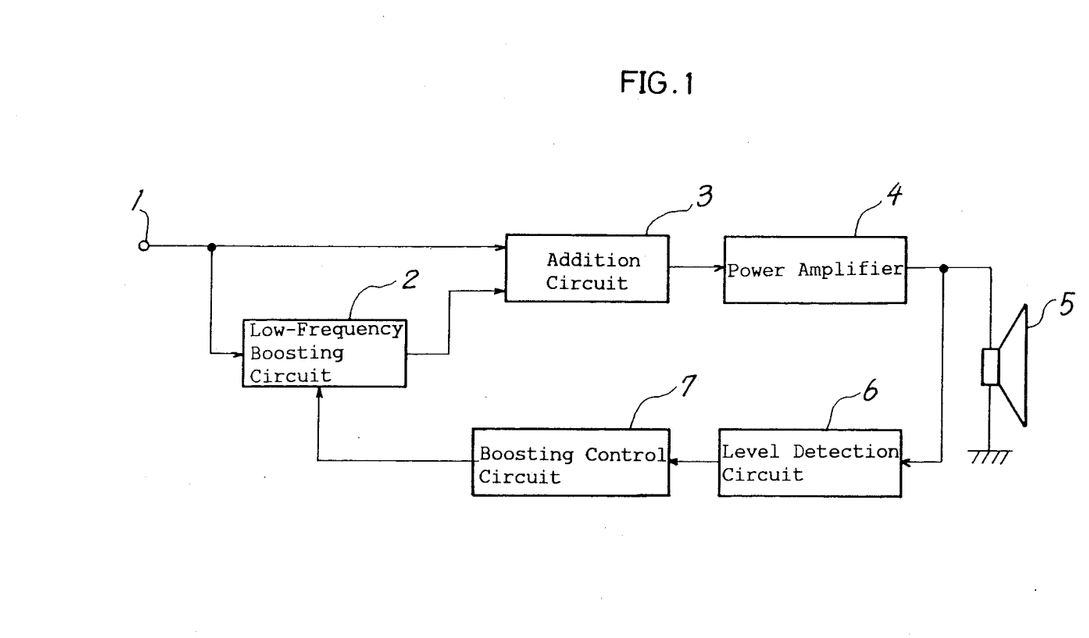
FIG. 1 is a block diagram showing the basic construction of an automatic loudness control circuit.

FIG. 1 shows the basic construction of an automatic loudness control circuit for use in a monaural signal reproduction system. The output signal of an audio signal source 1 is fed to a low frequency boosting circuit 2, which in turn extracts a low-frequency component from the output signal and boosts the component to prepare a low-frequency boost signal. The low-frequency boost signal is added to the output signal of the audio signal source 1 by an addition circuit 3 to obtain an output signal, which is then fed to a loudspeaker 5 via a power amplifier 4. The output level of the power amplifier 4 is detected by a level detection circuit 6. A boosting control circuit 7 controls the magnitude of boosting by the low frequency boosting circuit 2 in accordance with the detection signal from the level detection circuit 6. The boosting control circuit 7 prepares a control signal for increasing the magnitude of boosting by the low frequency boosting circuit 2 as the output level of the power amplifier 4 lowers to feed the control signal to the low frequency boosting circuit 2.

Figure 2:
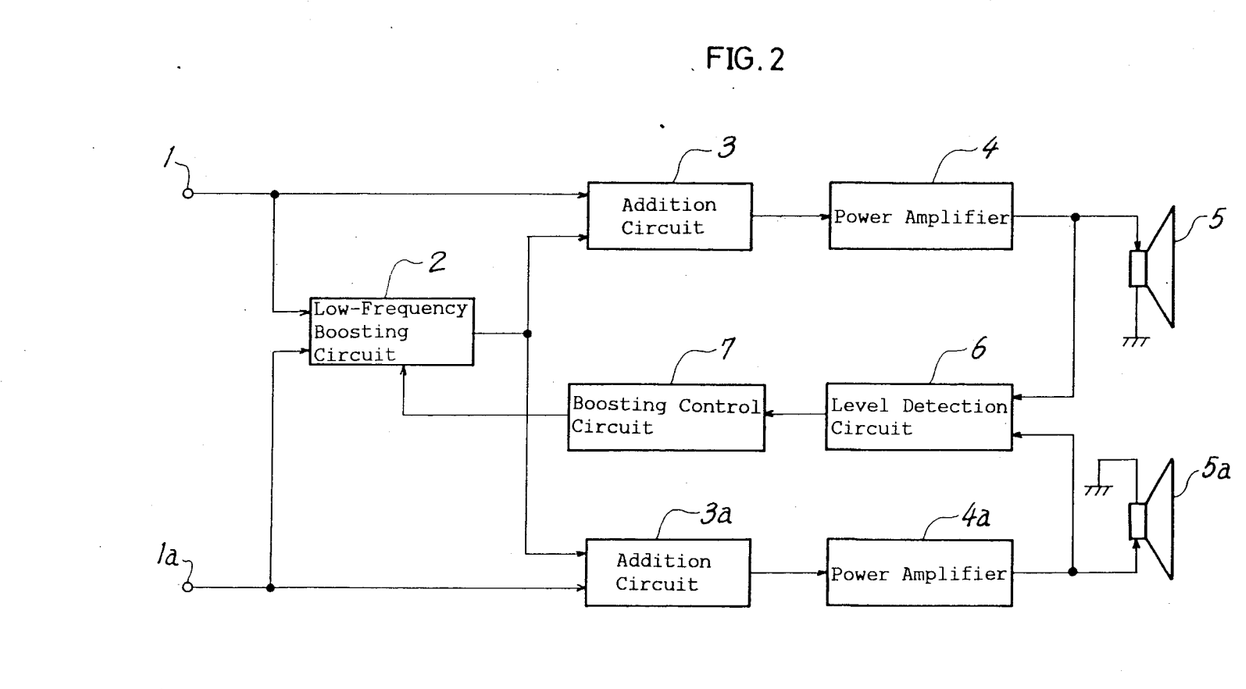
FIG. 2 is a block diagram showing the basic construction of an automatic loudness control circuit for use in a stereophonic reproduction system.

FIG. 2 shows the basic automatic loudness control circuit of the invention shown in FIG. 1, as adapted for use in a stereophonic audio signal reproduction system. The circuit of FIG. 2 comprises the circuit of FIG. 1 serving as a left signal channel and a right signal channel arranged in parallel to the left channel. The right signal channel comprises an audio signal source 1a, an addition circuit 3a, a power amplifier 4a and a loudspeaker 5a, and shares the low frequency boosting circuit 2, the level detection circuit 6 and the boosting control circuit 7 with the left signal channel.

Figure 3:
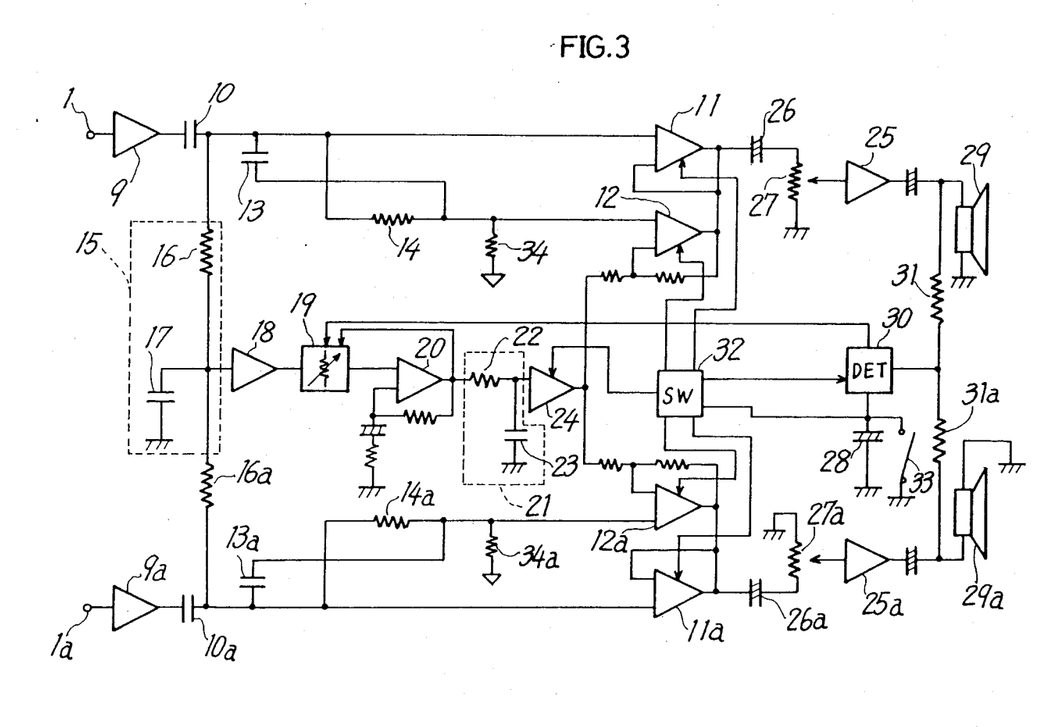
FIG. 3 is a circuit diagram showing a specific example of automatic loudness control circuit in detail.

The automatic loudness control circuit shown in FIG. 2 for stereophonic audio signal reproduction will be described in greater detail with reference to the specific example shown in FIG. 3. In the circuit of Fig. 3, the left signal channel and the right signal channel operate the same, so that a description will be given of the left signal channel only, and the right signal channel will not be described. Each circuit component of the right signal channel will be designated by the same reference number as the corresponding component of the left channel, with the adscript a attached to the reference number.

The audio signal from the audio signal source 1 is fed to a first buffer amplifier 11 via a preamplifier 9 and a capacitor 10, these components thus providing a signal channel for passing the audio signal therethrough without altering the frequency characteristics thereof.

A capacitor 13 and a resistor 14 are connected in parallel with the output terminal of the capacitor 10 and have their output terminals connected together and further connected to a first input terminal of an addition amplifier 12, whereby the high-frequency component of the audio signal through the capacitor 13 and the audio signal of entire frequency range as attenuated by the resistor 14 are mixed together to give a signal, which is applied to the first input terminal of the addition amplifier. The circuit from the output terminal of the capacitor 10 to the first input terminal of the addition amplifier 12 serves as a high frequency boosting circuit for boosting the high-frequency component of the audio signal.

Also connected to the output terminal of the capacitor 10 is a first low-pass filter 15 comprising a resistor 16 and a capacitor 17. The low-frequency component of the audio signal passing through the low-pass filter 15 is sent to a level control circuit 19 by way of a second buffer amplifier 18. The output signal of the boosting amplifier 20 to be described later and a control signal from the detection circuit 30 to be described later are fed to the level control circuit 19, whereby the extent of attenuation of the output signal from the second buffer amplifier 18 is controlled. The attenuated output signal of the second buffer amplifier is fed to the boosting amplifier 20 and is thereby boosted to a specified magnitude.

The output signal of the boosting amplifier 20 is passed through a second low-pass filter 21 comprising a resistor 22 and a capacitor 23 and then through a third buffer amplifier 24, and is applied to a second input terminal of the addition amplifier 12.

The circuit from the first low-pass filter 15 to the addition amplifier 12 serves as a low frequency boosting circuit, whereby the low-frequency component extracted from the audio signal is boosted to give a low-frequency boost signal.

The output terminal of the addition amplifier 12 is connected to a power amplifier 25 via a capacitor 26 and a volume-adjusting variable resistor 27. The output signal of the power amplifier 25 is applied to a loudspeaker 29 and is also sent to the level detection circuit 30 via a detection resistor 31.

The level detection circuit 30 prepares a level detection signal representing the output signal level of the power amplifier 25 and feeds the signal to the level control circuit 19 as a control signal.

A capacitor 28 and a manual switch 33 are connected to another terminal of the level detection circuit 30. The manual switch 33 produces an ON or OFF signal, which is sent to the detection circuit 30 and to a switching circuit 32.

Depending on whether the manual switch 33 is on or off, the switching circuit 32 is set to a loudness control mode or otherwise (loudness non-control mode) and on-off controls the first and third buffer amplifiers 11, 24 and the addition amplifier 12 according to the selected mode.

When the control circuit described above is not set for automatic loudness control, the manual switch 33 is turned on to set the switching circuit 32 to the loudness non-control mode. Consequently, the switching circuit 32 produces a control signal, which brings the addition amplifier 12 and the third buffer amplifier 24 out of operation, with the result that the output signal from the preamplifier 9 passes through the first buffer amplifier 11, is amplified by the power amplifier 25 and is applied to the speaker 29. Thus, the audio signal from the signal source 1 is amplified uniformly over the entire frequency range without being boosted over the low-frequency or high-frequency range and is released from the speaker 29 as a sound.

For automatic loudness control, the manual switch 33 is turned off to set the switching circuit 32 to the loudness control mode, whereupon the circuit 32 produces a control signal to deenergize the first buffer amplifier 11 and energize the addition amplifier 12, the third buffer amplifier 24 and the level detection circuit 30. Consequently, the output signal of the preamplifier 9 is attenuated by the resistors 14, 34 and sent to the addition amplifier 12, while the high-frequency component of the output signal is fed to the addition amplifier 12 via the capacitor 13.

Since the audio signal channel from the signal source 1 to the power amplifier 25 has no change-over switch, the mode can be changed by the switching circuit 32 without producing any noise due to switching.

The output signals of the preamplifiers 9, 9a of the two signal channels are mixed together by the first low-pass filter 15 and then fed to the level control circuit 19 via the second buffer amplifier 18. At this time, the level detection signal from the level detection circuit 30 and the output signal from the boosting amplifier 20 are fed to the level control circuit 19 as control signals, in accordance with which the output signal of the second buffer amplifier 18 is level-controlled before being applied to the boosting amplifier 20. Consequently, the low-frequency component is boosted by the level control circuit 19 and the boosting amplifier 20 to a magnitude in conformity with the output signal level of the power amplifiers 25, 25a, such that the magnitude of boosting decreases as the output signal level rises, or increases as the output signal level lowers.

The output signal of the boosting amplifier 20 is applied to the second input terminal of the addition amplifier 12 through the second low-pass filter 21 and the third buffer amplifier 24 and added to the high-frequency boost signal applied to the first input terminal of the amplifier 12 before amplification. At this time, the high-frequency component contained in the output signal of the preamplifier 9 is amplified by the addition amplifier 12 and then delivered, whereas the medium-frequency component is attenuated by the resistors 14, 34, thereafter amplified by the addition amplifier 12 and therefore delivered from the amplifier 12 as a signal component of substantially the same level as the output signal of the preamplifier 9.

Consequently available at the output terminal of the addition amplifier 12 is a mixed signal composed of the high-and medium-frequency component of substantially the same level as the output signal of the preamplifier 9 and the boosted low-frequency component. The mixed signal is amplified by the power amplifier 25, applied to the loudspeaker 29 and released therefrom as a sound. When the manufal switch 33 is off, accordingly, the audio signals are subjected to automatic loudness control in accordance with the output signal level of the power amplifiers 25, 25a.

While the left channel addition amplifier 12 is in operation, the right channel addition amplifier 12a is also in operation, and the boosted low-frequency component obtained at the output terminal of the third buffer amplifier 24 is applied also to the right channel power amplifier 25a via the addition amplifier 12a, with the result that the right and left channels are equal in low-frequency signal level to assure acoustically natural signal reproduction.

Figure 5:
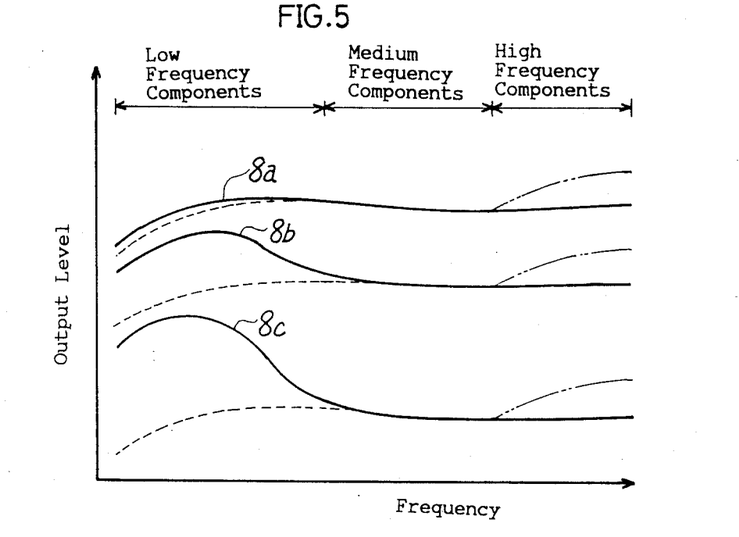
FIG. 5 is a graph showing the frequency characteristics realized by the automatic loudness control circuit.

When the output level of the audio signal source varies as indicated in broken lines in FIG. 5, the audio signal applied to the speaker has the frequency characteristics shown in solid lines. More specifically, the low-frequency component is boosted to an automatically adjusted magnitude according to the output signal level of the power amplifier as represented by solid lines 8a, 8b and 8c. Thus, the automatic loudness control circuit of the invention affords optimum loudness characteristics at all times. The high frequency boosting circuit included in the control circuit also boosts the high-frequency component by a specified magnitude as indicated in dot-and-dash lines in FIG. 5.

Most components of the circuit of FIG. 1 other than the capacitors 10, 26 and 17, etc. can be fabricated into an IC easily. IC fabrication car therefore be realized more advantageously than conventionally possible.

Further since the low frequency boosting circuit includes the low-pass filters 15, 21 preceding and subsequent to the boosting amplifier 20, it is possible to preclude clipping due to the high- and medium-frequency components of the audio signal and to give an improved S/N ratio unlike the case wherein the boosting circuit comprises only one of the filters.

Not only the level detection signal from the level detection circuit 30 but also the output signal of the boosting amplifier 20 is applied to the level control circuit 19, so that even if the level of the input audio signal rises at a reduced volume given by manipulating the variable resistor 27, the level control circuit 19 functions normally with the output signal of the boosting amplifier 20. This eliminates the likelihood that the boosting amplifier 20 will reach saturation to result in an impaired distortion factor.

The output control signal of the switching circuit 32 is not given to the second buffer amplifier 18, the level control circuit 19, the boosting amplifier 20 or the like, with the result that these circuits 18, 19 and 20 can be held in operation regardless of whether the manual switch 33 is on or off. The manual switch 33 is therefore operable without causing any potential variation.

The manual switch 33 which can not be incorporated into an IC need only be provided singly and can be connected to the terminal of the level detection circuit 30 along with the capacitor 28, so that the present circuit prepared in the form of an IC need not be provided with a connection pin specifically for the manual switch.

Figure 4:
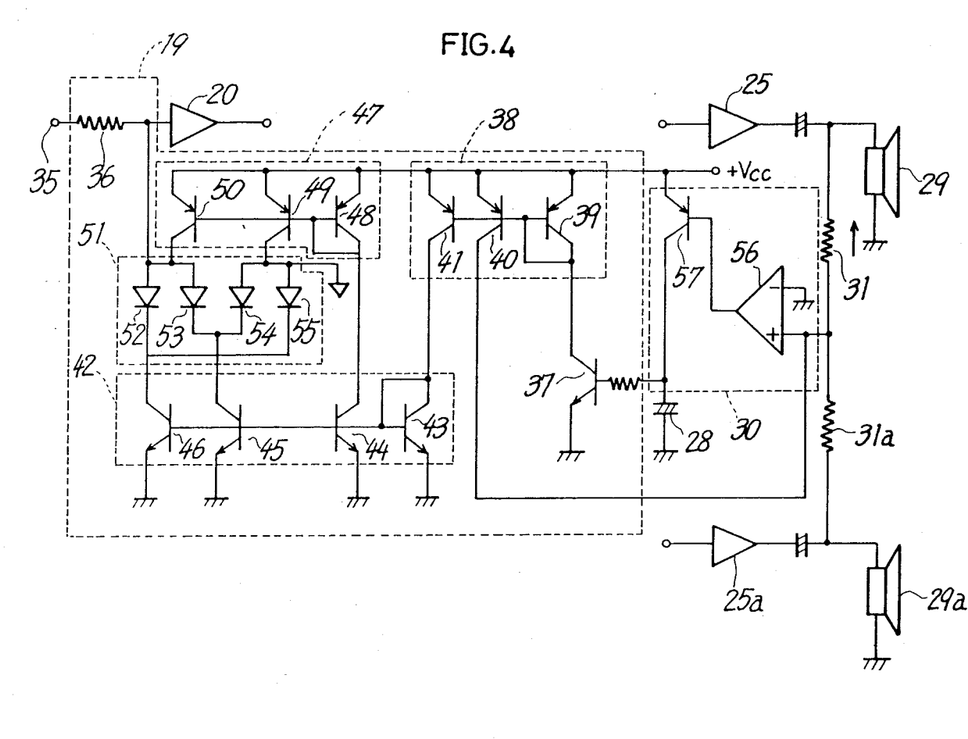
FIG. 4 is a circuit diagram showing a level control circuit and a level detection circuit specifically.

FIG. 4 shows the level control circuit 19 and the level detection circuit 30 of FIG. 3 in greater detail. The input terminal 35 of FIG. 4 corresponds to the output terminal of the second buffer amplifier 18 of FIG. 3.

The low-frequency component of the audio signal applied to the input terminal 35 is sent to the boosting amplifier 20 via the level control circuit 19.

In the level control circuit 19, the detection signal from the level detection circuit 30 is applied to the base of a first transistor 37. Connected to the collector of the first transistor is a first current mirror circuit 38 comprising second to fourth transistors 39, 40 and 41. The fourth transistor 41 has connected to its collector a second current mirror circuit 42 comprising fifth to eighth transistors 43, 44, 45 and 46. Connected to the collector of the sixth transistor 44 is a third current mirror circuit 47 comprising ninth to eleventh transistors 48, 49 and 50.

A current in accordance with the detection signal of the level detection circuit 30 flows through the collector of the first transistor 37. The first current mirror circuit 38 functions to pass a control current of the same value as the collector current of the first transistor 37 through the collector of the fifth transistor 43. Since the collector current of the sixth transistor 44 is equal to the collector current of the ninth transistor 48, the second and third current mirror circuits 42, 47 function to make the collector currents of the seventh, eighth, tenth and eleventh transistors 45, 46, 49, 50 equal to the control current through the collector of the fifth transistor 43. Accordingly, the collector currents of the seventh, eighth, tenth and eleventh transistors 45, 46, 49, 50 can be varied at the same time in accordance with the magnitude of the detection signal of the detection circuit 30 while being maintained at equal values.

Connected between the second current mirror circuit 42 and the third current mirror circuit 47 is a variable impedance circuit 51 comprising bridge-connected first to fourth diodes 52, 53, 54, 55. Each of these diodes 52 to 55 comprises a Schottky barrier diode. The anodes of the first and second diodes 52, 53 are connected together, and the collector of the eleventh transistor 50 is connected to the connection. The anodes of the third and fourth diodes 54, 55 are connected together, and the collector of the tenth transistor 49 is connected to the connection. The cathodes of the first and fourth diodes 52, 55 are connected together, and the connection is connected to the collector of the eighth transistor 46. The cathodes of the second and third diodes 53, 54 are connected together, and the connection is connected to the collector of the seventh transistor 45. The connection of the third and fourth diodes 54, 55 are connected to a signal reference voltage.

Consequently, the eleventh transistor 50 serves as a first current source for supplying a bias current to the anodes of the first and second diodes 52, 53, and the tenth transistor 49 serves as a second current source for supplying a bias current to the anodes of the third and fourth diodes 54, 55. The eight transistor 46 serves as a third current source for withdrawing a current from the cathodes of the first and fourth diodes 52, 55. The seventh transistor 45 serves as a fourth current source for withdrawing a current from the cathodes of the second and third diodes 53, 54. Further the fifth transistor 43, the sixth transistor 44 and the ninth transistor 48 constitute a current control circuit for varying the currents through the first to fourth current sources while maintaining the currents at substantially equal values.

The connection between the anodes of the first and second diodes 52, 53 serves as a signal terminal for the variable impedance circuit 51, and a resistor 36 is connected between the signal terminal and the input terminal 35 to cause the resistor 36 and the impedance circuit 51 to voltage-divide the signal fed to the input terminal 35 to control the extent of attenuation of the signal to be fed to the boosting amplifier 20.

With the level control circuit 19 described above, the impedance of the variable impedance circuit 51 as viewed from the signal input terminal is controlled based on the detection signal from the level detection circuit 30, whereby the level of the signal to be fed to the boosting amplifier 20 is controllable.

The output terminals of the left power amplifier 25 and the right power amplifier 25a are connected to each other via a first detection resistor 31 and second detection resistor 31a. The connection is connected to the level control circuit 19 via the level detection circuit 30 which comprises a comparative amplification circuit 56 and a twelfth transistor 57. The amplification circuit 56 has a positive input terminal connected to the connection between the resistors 31, 31a and a negative input terminal which is grounded. The amplification circuit 56 feeds an output signal to the base of the twelfth transistor 57, whereby the transistor is brought into or out of conduction. The capacitor 28 for smoothing the output signal of the transistor is connected to the collector of the twelfth transistor 57. Accordingly, a current in accordance with the terminal voltage of the capacitor 28 flows through the first transistor 37 constituting the level control circuit 19.

The collector of the third transistor 40 included in the first current mirror circuit 38 is connected to the positive input terminal of the comparative amplification circuit 56, thus forming a feedback channel to the amplification circuit 56.

When the output signals of the left and right power amplifiers 25, 25a are positive relative to a reference level, the comparative amplification circuit 56 produces "H" output since the negative input terminal of the circuit 56 is grounded, turning off the twelfth transistor 57. Accordingly, the capacitor 28 is not charged, and the second transistor 39 of the first current mirror circuit 38 is held off, with no bias current supplied to the variable impedance circuit 51. Consequently, the signal applied to the input terminal 35 is fed to the boosting amplifier 20 and amplified thereby without being attenuated by the impedance circuit 51.

When the output signals of the left and right power amplifiers 25, 25a become negative relative to the reference level, a current flows through the first detection resistor 31 in the direction of arrow shown, thereby causing the comparative amplification circuit 56 to produce "L" output to charge the capacitor 28. While the negative output signal level of the left amplifier 25 is low at this time, the terminal voltage of the capacitor 28 does not build up, and the first transistor 37 remaining off to hold the impedance circuit 51 unenergized. When the negative output signal level of the left power amplifier 25 rises, the output of the amplification circuit 56 lowers sufficiently to increase the collector current of the twelfth transistor 57, thereby raising the terminal voltage of the capacitor 28 to turn on the first transistor 37.

When the first transistor 37 is brought into conduction, the first to third current mirror circuits 38, 42, 47 function, passing through the impedance circuit 51 a current in conformity with the detection signal of the level detection circuit 30. Suppose the input-output current ratio of the first current mirror circuit 38 is $n_1$, and the input-output current ratio of the second and third current mirror circuits 42, 47 is $n_2$. The current flowing through the first to fourth diodes 52 to 55 of the variable impedance circuit 51 has the value of $n_1 n_2 I_1$ wherein $I_1$ is the collector current of the first transistor 37. The impedance values of these diodes are in conformity with the current value $n_1 n_2 I_1$. Consequently, the signal applied to the input terminal 35 is voltage-divided by the resistor 36 and the combined impedance of the first to fourth diodes 52 to 55 for attenuation and thereafter amplified by the boosting amplifier 20.

Further when the first transistor 37 conducts, a current $n_1 I_1$ proportional to the collector current of the transistor flows through the collector of the third transistor 40 of the first current mirror circuit 38, then through the feedback channel into the first detection resistor 31, consequently deenergizing the comparative amplification circuit 56 and turning off the twelfth transistor 57. Nevertheless, the first transistor 37 remains on since the capacitor 28 has a sufficiently great discharge time constant, holding the impedance circuit 51 also in operation. The amplification circuit 56 is thereafter brought into operation when the level of the negative output signals of the power amplifiers 25, 25a rises to such an extent as to pass a current greater than the collector current $n_1 I_1$ through the third transistor 40. Thus, the level detection circuit comprising the amplification circuit 56, twelfth transistor 57, capacitor 28 and the feedback channel from the third transistor 40 functions as a peak current detection circuit which gives an output waveform holding the peak of the input current waveform.

The circuit operation described above will be summarized as follows. When the output signal level of the left and right power amplifiers 25, 25a exceeds a predetermined value, the variable impedance circuit 51 functions to attenuate the input signal to the input terminal 35 according to the output signal level, and the input signal is held attenuated in conformity with the discharge time constant of the capacitor 28. Only when an output signal is given which is higher than the output signal level, the comparative amplification circuit 56 thereafter functions to control the variable impedance circuit 51 so that the impedance of this circuit becomes lower.

Accordingly, the automatic loudness control circuit of FIG. 3, when incorporating the above circuit, effects loudness control in accordance with the level of the sound signal to be released from the speakers, consequently giving the frequency characteristics represented by the solid lines 8a, 8b, 8c in FIG. 5. Furthermore, even when the variable resistor 27 is manipulated to alter the volume from large to small, the smoothing function of the capacitor 28 precludes marked low frequency boosting. The reproduction therefore will not sound strange.

The variable impedance circuit 51 included in the level control circuit 19 of FIG. 4 comprises Schottky barrier diodes and is accordingly about 0.4 V in the lowest operating voltage, such that a sufficient dynamic range is available even if the power supply used has a voltage as low as 1.5 V. Since the Schottky barrier diode affords an impedance equivalent to that of a PN junction diode with a relatively low bias voltage, the circuit can therefore be easily fabricated in the form of an IC.

With the circuit shown in FIG. 4, the output signal level of the left and right power amplifiers 25, 25a is detected in the current mode, so that even if the detection resistors 31, 31a are made to have such a small resistance value as to be fabricated into the IC, no crosstalk occurs between the output signals of the two power amplifiers 25, 25a. The impedance of the variable impedance circuit 51 is controlled with a current in accordance with the output signal level of the power amplifiers and is therefore less susceptible to the influence of variations in the transistor characteristics. Accordingly, the impedance is controllable with high accuracy, permitting the level control circuit 19 to operate normally even in the presence of some variations in the power supply voltage.

The construction of the present circuit is not limited to those of the foregoing embodiments but can be modified variously by one skilled in the art without departing from the scope of the invention as defined in the appended claims.

What is claimed is:

1. A loudness control circuit for controlling magnitude of boosting of a low-frequency component of an audio signal in accordance with a level of an output of a power amplifier for driving a loudspeaker, the loudness control circuit comprising:

(a) an audio signal source which produces an audio signal,
   (b) a low frequency boosting circuit responsive to the audio signal for extracting a low-frequency component from the audio signal and boosting the low-frequency component to provide a low-frequency boost signal,
   (c) an addition circuit for adding the low-frequency boost signal to the audio signal of the audio signal source to produce an addition signal, the low frequency boosting circuit forward feeding the low-frequency boost signal tot he addition circuit,
   (d) a power amplifier for amplifying a sum signal of the addition circuit to produce the output and for feeding the output to a loudspeaker,
   (e) a level detection circuit responsive to a lowering of the output of the power amplifier below a predetermined level for producing a detection signal, and
   (f) a boosting control circuit for controlling the magnitude of boosting by the low frequency boosting circuit in response to the detection signal of the level detection circuit, the boosting control circuit being operable to provide a control signal for increasing the magnitude of boosting by the low-frequency boosting circuit as the output of the power amplifier drops below a predetermined level and to feed the control signal to the low frequency boosting circuit.

2. A loudness control circuit as defined in claim 1, wherein the low frequency boosting circuit comprises a first low-pass filter connected to an output terminal of the audio signal source for producing a filtered output, a level control circuit for attenuating the filtered output of the first low-pass filter to produce an attenuated signal a boosting amplifier for amplifying the attenuator signal boosted signal, and a second low-pass filter connected to an output terminal of the boosting amplifier, the level control circuit having an extent of attenuation which is controllable based on the detection signal of the level detection circuit.

3. A loudness control circuit as defined in claim 2, wherein the level control circuit is controlled based on the detection signal of the level detection circuit and the boosted signal of the boosting amplifier.

4. A loudness control circuit as defined in claim 2, wherein the level control circuit comprises a variable impedance circuit composed of bridge-connected first to fourth diodes, a first current source for supplying a bias current to a common anode of the first and second diodes, a second current source for supplying a bias current to a common anode of the third and fourth diodes, a third current source for withdrawing a current from a common cathode of the first and fourth diodes, a fourth current source for withdrawing a current from a common cathode of the second and third diodes, and a current control circuit for equally varying currents through the first to fourth current sources in accordance with a control signal that is based on the detection signal of the level detection circuit so as to thereby provide controlled current, one of the common anodes and the common cathodes of the first to fourth diodes being a signal terminal, an impedance of the variable impedance circuit as viewed from the signal terminal being variable in accordance with the controlled current.

5. A loudness control circuit as defined in claim 4, wherein each of the first to fourth diodes comprises a Schottky barrier diode.

6. A loudness control circuit as defined in claim 1, wherein a high frequency boosting circuit for boosting a high-frequency component of the audio signal from the audio signal source is provided in electrical connection between the audio signal source and the addition circuit.

7. A loudness control circuit as defined in claim 6, wherein the high frequency boosting circuit comprises a first circuit for passing therethrough as an output only the high-frequency component of the audio signal from the audio signal source, and a second circuit for attenuating the audio signal of the audio signal source to a specified level to produce an output, and means for mixing together the outputs of the fist and second circuits to provide a mixed signal and feeding the mixed signal to the addition circuit.

8. A loudness control circuit as defined in claim 1, wherein the level detection circuit comprises a comparative amplification circuit for detecting a level of the output of the power amplifier, a capacitor chargeable in accordance with the output signal of the comparative amplification circuit, a transistor for producing an output current in accordance with the terminal voltage of the capacitor, and a feedback channel for feeding back the output current of the transistor to the comparative amplification circuit.

9. A loudness control circuit as defined in claim 1, further comprising a signal channel for feeding the audio signal of the audio signal source to the power amplifier with original frequency characteristics, a buffer amplifier provided in the signal channel, the buffer amplifier and an addition amplifier each having an output terminal connected together and further connected to an input terminal of the power amplifier, and a switching circuit for controlling operation of the buffer amplifier and the addition amplifier, the switching circuit being settable to a loudness control mode to thereby deenergize the buffer amplifier and energize the addition amplifier, the switching circuit being settable to a loudness non-control mode to thereby energize the buffer amplifier and deenergize the addition amplifier.

10. A loudness control circuit, wherein a magnitude of boosting of a low-frequency component of an audio signal is controlled in accordance with a level of output of a power amplifier for driving a loud-speaker, the loudness control circuit comprising:

(a) a left channel audio signal source which produces a left audio signal,
(b) a right channel audio signal source which produces a right audio signal,
(c) a low frequency boosting circuit for extracting a low-frequency component from the audio signal of each of the audio signal sources and for mixing the two low-frequency components into a mixed signal and then boosting the mixed signal to provide a low-frequency boost signal,
(d) a first addition circuit for adding the low-frequency boost signal to the left audio signal to provide a first added signal,
(e) a second addition circuit for adding the low-frequency boost signal to the right audio signal to provide a second added signal,
(f) a left channel power amplifier for amplifying and then feeding said first added signal to a left channel loudspeaker,
(g) a right channel power amplifier for amplifying and then feeding said second added signal to a right channel loudspeaker,
(h) a level detection circuit responsive to a lowering of an output of the two power amplifiers below a predetermined level for producing a detection signal, and
(i) a boosting control circuit for controlling magnitude of boosting by the low frequency boosting circuit in response to the detection signal of the level detection circuit, the boosting control circuit being operable to provide a control signal for increasing a magnitude of boosting by the low frequency boosting circuit as a level of the output of both of the power amplifiers drops below the predetermined level and to feed the control signal to the low frequency boosting circuit.

* * * * *